(12) United States Patent
Elpelt et al.

(10) Patent No.: US 7,615,802 B2
(45) Date of Patent: Nov. 10, 2009

(54) SEMICONDUCTOR STRUCTURE COMPRISING A HIGHLY DOPED CONDUCTIVE CHANNEL REGION AND METHOD FOR PRODUCING A SEMICONDUCTOR STRUCTURE

(75) Inventors: Rudolf Elpelt, Erlangen (DE); Heinz Mitlehner, Uttenreuth (DE); Reinhold Schörner, Grossenseebach (DE)

(73) Assignee: SiCED Electronics Development GmbH & Co. KG, Erlangen (DE)

( * ) Notice: Subject to any disclaimer, the term of this patent is extended or adjusted under 35 U.S.C. 154(b) by 430 days.

(21) Appl. No.: 10/549,784

(22) PCT Filed: Mar. 19, 2003

(86) PCT No.: PCT/DE03/00906

§ 371 (c)(1),
(2), (4) Date: Jul. 10, 2006

(87) PCT Pub. No.: WO2004/084310

PCT Pub. Date: Sep. 30, 2004

(65) Prior Publication Data

US 2006/0255373 A1    Nov. 16, 2006

(51) Int. Cl.
*H01L 29/80* (2006.01)
*H01L 21/00* (2006.01)

(52) U.S. Cl. .................. 257/135; 257/263; 257/265; 257/287; 257/E21.375; 438/193; 438/194

(58) Field of Classification Search .............. 257/260, 257/263–270, 280–283, 287, 497, 498, 134–136, 257/504, 196–197, 192, E21.375; 438/192, 438/193, 194
See application file for complete search history.

(56) References Cited

U.S. PATENT DOCUMENTS

| 5,543,637 | A | | 8/1996 | Baliga |
| 5,923,051 | A | | 7/1999 | Harris et al. |
| 5,952,699 | A | | 9/1999 | Yamazaki et al. |
| 6,034,385 | A | | 3/2000 | Stephani et al. |
| 6,117,735 | A | * | 9/2000 | Ueno ................. 438/268 |
| 6,150,611 | A | | 11/2000 | Imai |
| 6,150,671 | A | | 11/2000 | Harris et al. |

(Continued)

FOREIGN PATENT DOCUMENTS

DE    196 29 088 A1    1/1997

(Continued)

*Primary Examiner*—Evan Pert
*Assistant Examiner*—Scott R Wilson
(74) *Attorney, Agent, or Firm*—Laurence A. Greenberg; Werner H. Stemer; Ralph E. Locher

(57) ABSTRACT

The invention relates to a semiconductor structure for controlling a current (I), comprising a first n-conductive semiconductor region (2), a current path that runs within the first semiconductor region (2) and a channel region (22). The channel region (22) forms part of the first semiconductor region (2) and comprises a base doping. The current (I) in the channel region (22) can be influenced by means of at least one depletion zone (23, 24). The channel region (22) contains an n-conductive channel region (225) for conducting the current, said latter region having a higher level of doping than the base doping. The conductive channel region (225) is produced by ionic implantation in an epitaxial layer (262) that surrounds the channel region (22).

20 Claims, 7 Drawing Sheets

U.S. PATENT DOCUMENTS

Figure 1:
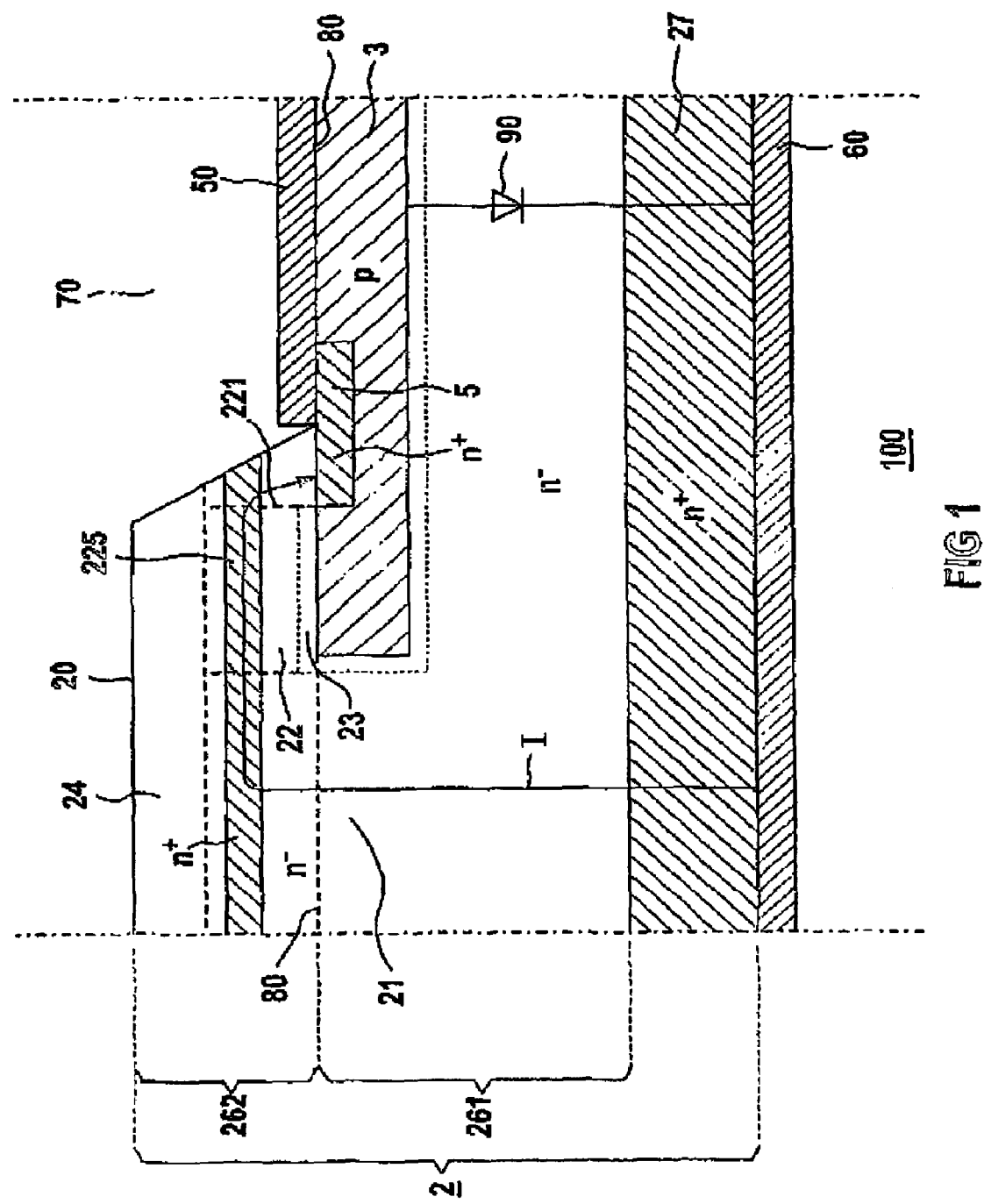

| | | |
|---|---|---|
| 6,204,135 B1 | 3/2001 | Peters et al. |
| 6,232,625 B1 | 5/2001 | Bartsch et al. |
| 6,274,904 B1 | 8/2001 | Tihanyi |
| 6,455,892 B1 | 9/2002 | Okuno et al. |
| 6,653,666 B2 | 11/2003 | Mitlehner et al. |
| 6,693,322 B2 | 2/2004 | Friedrichs et al. |
| 7,145,191 B1 * | 12/2006 | Teng et al. .......... 257/288 |
| 2002/0020849 A1 | 2/2002 | Mitlehner et al. |

FOREIGN PATENT DOCUMENTS

| | | |
|---|---|---|
| DE | 199 00 169 A1 | 7/1999 |
| DE | 198 33 214 C1 | 8/1999 |
| DE | 198 39 970 A1 | 3/2000 |
| JP | 55-99772 | 7/1980 |
| JP | 10065165 A | 3/1998 |
| JP | 11-266017 | 9/1999 |
| JP | 2001094096 A | 4/2001 |
| JP | 2004505453 T | 2/2004 |
| WO | 00/16403 | 3/2000 |
| WO | WO 0209195 A1 | 1/2002 |
| WO | 02/29900 A2 | 4/2002 |

* cited by examiner

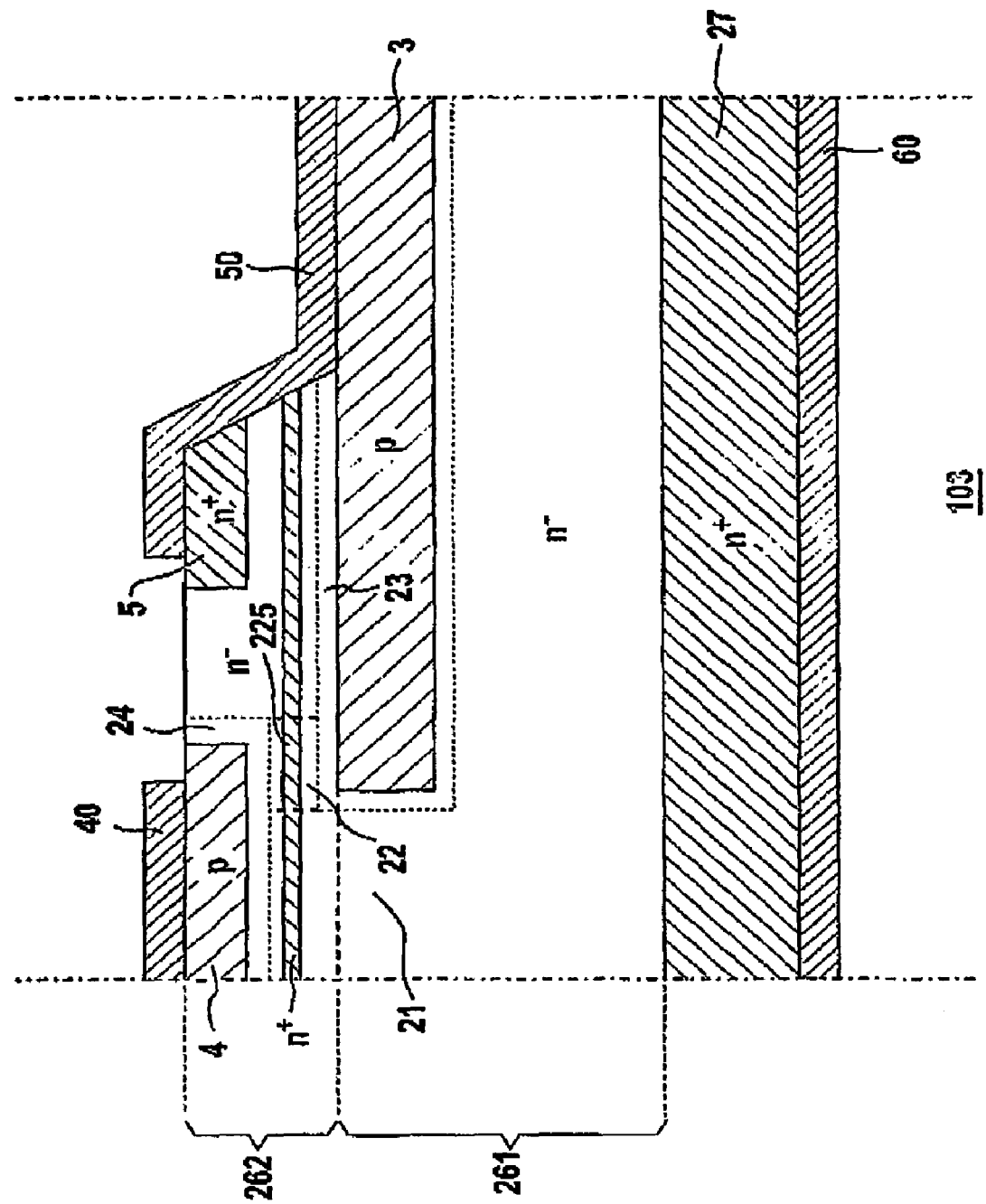

SEMICONDUCTOR STRUCTURE COMPRISING A HIGHLY DOPED CONDUCTIVE CHANNEL REGION AND METHOD FOR PRODUCING A SEMICONDUCTOR STRUCTURE

The invention relates to a semiconductor configuration for controlling a current, the semiconductor configuration comprising at least a first semiconductor region of a first conductivity type (n or p), a current path running at least partially within the first semiconductor region, and a channel region, which is part of the first semiconductor region, which has a basic doping and within which the current can be influenced by means of at least one depletion zone. Such a semiconductor configuration is disclosed in U.S. Pat. No. 6,034,385, for example. Moreover, the invention relates to a method for producing a semiconductor configuration.

In order to supply an electrical load with a rated electric current, the load is usually connected to an electrical supply network via a switching device. During the switch-on operation and also in the case of a short circuit, an overcurrent occurs which lies significantly above the rated current. In order to protect the electrical load, the switching device connected between the load and the electrical network must be able to limit and also switch off said overcurrent. Furthermore, in converter technology, for example, there are applications in which the load, in the case of a voltage present in the reverse direction, is also intended to be reliably isolated from the supply network. Current-limiting switches in the form of a semiconductor configuration are known for the functions described.

Thus, U.S. Pat. No. 6,034,385 and also WO 00/16403 A1 describe a semiconductor configuration, in which a current flow between a first and a second electrode is controlled. In particular the current can be switched on and off or be limited to a maximum value. The active part of the semiconductor configuration comprises a first semiconductor region of a predetermined conductivity type, in particular the n conductivity type. The conductivity type is determined by the type of charge carriers with which the semiconductor region is doped. For current control, at least one lateral channel region is provided within the first semiconductor region, In this case, lateral or else horizontal is understood to mean a direction parallel to a main surface of the first semiconductor region. By contrast, vertical denotes a direction running perpendicularly to the main surface. The lateral channel region is bounded in the vertical direction by at least one p-n junction, in particular by the depletion zone (zone with depletion of charge carriers and hence high electrical resistance; space charge zone) of said p-n junction. The vertical extent of said depletion zone can be set inter alia by a control voltage. The p-n junction is formed between the first semiconductor region and a buried p-conducting island region. The buried island region undertakes the shielding of the first electrode with respect to the high electric field in the reverse direction or in the switched-off state. In specific embodiments, the channel region can also be bounded by a further depletion zone in the vertical direction. Said further depletion zone is brought about for example by a further p-n junction between a second p-conducting semiconductor region and the first n-conducting semiconductor region. The second p-conducting semiconductor region can also be connected to a control voltage by means of a control electrode. The channel region that is crucial for the current control is arranged within an epitaxial layer. Fluctuations in thickness and dopant concentration may occur during the production of said epitaxial layer. This directly affects the current-controlling properties of the channel region. It is possible, therefore, for the semiconductor configuration not to have the required current control behavior, for example a specific pinch-off voltage, at the end of the production process on account of the tolerances of the epitaxial layer. The achievable yield thus decreases.

A similar semiconductor configuration is described in DE 196 29 088 A1. Consequently, a similarly low technology-dictated yield may occur during production in the case of this semiconductor configuration as well.

U.S. Pat. No. 6,232,625 discloses a passive embodiment of the above-described semiconductor configuration according to U.S. Pat. No. 6,034,385. The second p-conducting semiconductor region is also connected to the first electrode. A construction without active current control then results, that is to say that the current flow through the semiconductor configuration cannot be influenced by an external control voltage. Rather, the semiconductor configuration disclosed is a passive current limiter.

Furthermore, U.S. Pat. No. 5,543,637 discloses a semiconductor configuration which comprises a first semiconductor region of a first conductivity type with a buried island region of a conductivity type opposite to the first, and also two electrodes and a control electrode. The respective depletion zones brought about by the control electrode and the buried island region again form a channel region in which a current flowing between the two electrodes is controlled. The control electrode is embodied either as a Schottky contact or as a MOS contact. 3C, 6H or 4H silicon carbide (SiC) is used as semiconductor material. In this case, too, the channel region is arranged in an epitaxial layer whose thickness and dopant concentration are subjected to fluctuations.

Furthermore, DE 198 33 214 C1 discloses a semiconductor configuration which is realized using SiC, in particular, and in which an n-conducting lateral channel region bounded by two p-conducting semiconductor regions is provided for current control. The channel region is once again situated in an epitaxial layer, so that in this case, too, a reduced yield is possible during production for the reasons mentioned above.

U.S. Pat. Nos. 6,150,671 and 5,923,051 describe semiconductor configurations each in the form of an SiC-MOSFET. In this case, channel regions are again situated in a p-conducting and respectively in an n-conducting layer grown epitaxially.

The invention is based on the object of specifying a semiconductor configuration of the type referred to in the introduction, which, during production, is insensitive to technology-dictated fluctuations and enables a high yield. Moreover, the intention is to specify a method for producing such a semiconductor configuration.

A semiconductor configuration in accordance with the features of the independent patent claim 1 is specified in order to achieve the object relating to the semiconductor configuration.

The semiconductor configuration according to the invention for controlling a current is a semiconductor configuration of the type referred to in the introduction in which the channel region advantageously comprises a channel conduction region intended for carrying current and having the first conductivity type and a higher doping compared with the basic doping.

The invention is based on the insight that a zone that is additionally provided in the channel region and has a higher dopant concentration compared with the rest of the channel region can considerably reduce, if not even completely eliminate, the sensitivity of the semiconductor configuration toward technology-dictated fluctuations during production. The additionally provided zone, which is referred to here as channel conduction region, is doped with dopants of the same charge carrier type (n or p) as the channel region. It essentially determines the electrical properties of the channel region. The current is thus preferably carried in the channel conduction region in on-state operation on account of the higher doping and the higher conductivity accompanying this. By contrast, the rest of the channel region remains largely free of current, so that fluctuations in the basic doping or thickness that are present here, for instance, are then unimportant or only of secondary importance. The channel conduction region may be produced for example by means of ion implantation with very high accuracy and small fluctuations in dopant concentration and thickness. This new independence thus afforded with respect to the technology-dictated fluctuations results in an increased yield in the process for producing the semiconductor configuration.

Advantageous refinements of the semiconductor configuration according to the invention emerge from the claims dependent on claim 1.

In one favorable embodiment, the channel conduction region contains at least 80% of the total charge of the first conductivity type that is present overall in the channel region. Thus, at most only the remaining 20% of the total charge, situated outside the channel conduction region in the channel region, is subjected to the technology-dictated fluctuations. This positive effect can be increased further in that even at least 90% of the total charge of the first conductivity type present within the channel region is provided in the channel conduction region.

A so-called vertical semiconductor configuration is favorable, in the case of which the current is guided essentially in the vertical direction through the semiconductor configuration. This embodiment is capable of carrying a particularly high reverse voltage in the off-state situation. However, a lateral semiconductor configuration with a current flow that essentially runs in the lateral direction through the semiconductor configuration is also possible, in principle.

The current control is effected by means of a preferably lateral channel region. In this embodiment, it is possible both for the current that is to be carried to be reliably switched on and off and for a high reverse voltage to be taken up by the semiconductor configuration.

In a further preferred variant, the semiconductor configuration is present in the form of a field effect transistor, in particular in the form of a junction field effect transistor (JFET). This type of transistor is particularly well suited to the current control desired in connection with the present invention.

In one advantageous refinement, the semiconductor configuration is composed partially or else completely of a semiconductor material having a band gap of at least 2 eV. Examples of suitable semiconductor materials are diamond, gallium nitride (GaN), indium phosphite (InP) or preferably silicon carbide (SiC). The abovementioned semiconductor materials, in particular SiC, are very advantageous on account of the extremely low intrinsic charge carrier concentration (=charge carrier concentration without doping) and the very low on-state loss. Moreover, the abovementioned semiconductor materials have a significantly higher breakdown strength compared with the "universal semiconductor" silicon, so that the semiconductor configuration can be used at a higher voltage. The preferred semiconductor material is silicon carbide, in particular monocrystalline silicon carbide of the 3C or 4H or 6H or 15R polytype.

Furthermore, a variant is possible in which the semiconductor configuration comprises an island region that is at least partially buried within the first semiconductor region. Said island region has a second conductivity type (p or n) opposite to the first conductivity type (n or p). The island region forms a p-n junction with the first semiconductor region, the depletion zone of which p-n junction can be used for controlling the channel region and hence also the current flow.

In another advantageous embodiment, at least one channel compensation region is arranged within the channel conduction region. The channel conduction region preferably contains a plurality of said channel compensation regions. The channel compensation region has, in particular, a doping with a second conductivity type (p or n) opposite to the first conductivity type (n or p). When reverse control voltage is present, the charge present in the channel compensation regions compensates for the charge present in the channel conduction region, so that it is possible to further increase the dopant concentration of the first charge carrier type in the channel conduction region. By virtue of the compensation, this does not lead to an impairment of the electrical behavior of the semiconductor configuration; in particular, this does not lead to an undesirable increase in the control voltage (=pinch-off voltage) required for the complete pinch-off of the channel region. This affords advantages particularly when a small pinch-off voltage of less than 15V, for example, is required. Starting from an increase in the dopant concentration of the first conductivity type in the channel conduction region by at least the factor 2 compared with the embodiment without channel compensation regions, the loss of area due to the compensation regions is at least made up for, if not even over compensated, on account of the then considerably increased conductivity in the channel conduction region.

It is advantageous if the at least one channel compensation region or, in the case of a plurality of channel compensation regions, the individual channel compensation region in each case has or have a higher dopant concentration than the channel conduction region. The area proportion of the channel conduction region is then greater than that of all the channel compensation regions. This is favorable since the current is intended to be carried within the channel conduction region and, therefore, a maximum proportion of the channel conduction region should also be available for this. At the same time, the advantageous compensating effect described is preserved in the off-state situation.

Preference is given to a refinement in which the total charge of the first conductivity type that is present overall in the channel conduction region is approximately equal in magnitude to the total charge of the second conductivity type present in all the channel compensation regions. A very good compensation effect is then achieved.

In another advantageous variant, the channel region is arranged within an epitaxial layer. The technology-dictated fluctuations in the dopant concentration and thickness within the epitaxial layer are unimportant on account of the additionally present channel conduction region for the reasons mentioned above. Furthermore, it is possible for the first semiconductor region to have a second epitaxial layer, which is formed in particular as a drift zone which, in the off-state situation, takes up a substantial part of the reverse voltage present. The two epitaxial layers fulfill different tasks in each case. One serves for current control, and the other for taking up reverse voltage. In an expedient manner, it is nevertheless possible, in a further variant, for both epitaxial layers to have an essentially identical basic doping. By virtue of the channel conduction region that critically determines the current control behavior, the basic doping of the epitaxial layer in which the channel region is arranged may be designed according to other standpoints. This is because it is favorable for no jump in doping to occur at the interface between the two epitaxial layers. The semiconductor configuration can then carry a higher reverse voltage.

Furthermore, there is a variant in which the first semiconductor region is arranged on a substrate having the opposite conductivity type to the first conductivity type. Both charge carrier types—electrons and holes—are then involved in carrying the current. A very favorable current conduction behavior is established on account of the bipolar modulation. Moreover, the additional p-n junction between the first semiconductor region and the substrate gives rise to suitability for a high reverse voltage.

In principle, the channel conduction region can advantageously be used both in the case of a normally-on semiconductor configuration and in the case of a normally-off semiconductor configuration.

A method in accordance with the features of claim 17 is specified in order to achieve the object relating to the method. The method according to the invention for producing a semiconductor configuration for controlling a current is a method in which at least a semiconductor substrate is provided, an epitaxial layer with a basic doping is applied to the semiconductor substrate, the epitaxial layer comprising a channel region, within which the current can be influenced, and a channel conduction region intended for carrying current and having a higher doping compared with the basic doping is implanted into the epitaxial layer at least in the region of the channel region.

This method is advantageous in particular because usually only a basic doping with a relatively high fluctuation range of approximately ±15%, for example, can be produced by means of an epitaxy method. By means of an ion implantation used for producing the channel conduction region, by contrast, the doping can be set significantly more precisely. The channel conduction region which is critical for the current control, then has only very little fluctuation in its dopant concentration.

Refinements of the method in accordance with the claims dependent on claim 17 are advantageous.

What is particularly advantageous is a method variant in which a further epitaxial layer is applied to the semiconductor substrate. The two epitaxial layers are preferably applied to the semiconductor substrate progressively and one above the other. It is favorable, moreover, for the two epitaxial layers to have essentially the same basic doping. The ion implantation of the channel conduction region takes place after the conclusion of the epitaxial method steps for the application of the two epitaxial layers. This method makes it possible, with a high yield, to produce a semiconductor configuration which is intended for current control and has, in particular, the advantages mentioned above.

Figure 2:
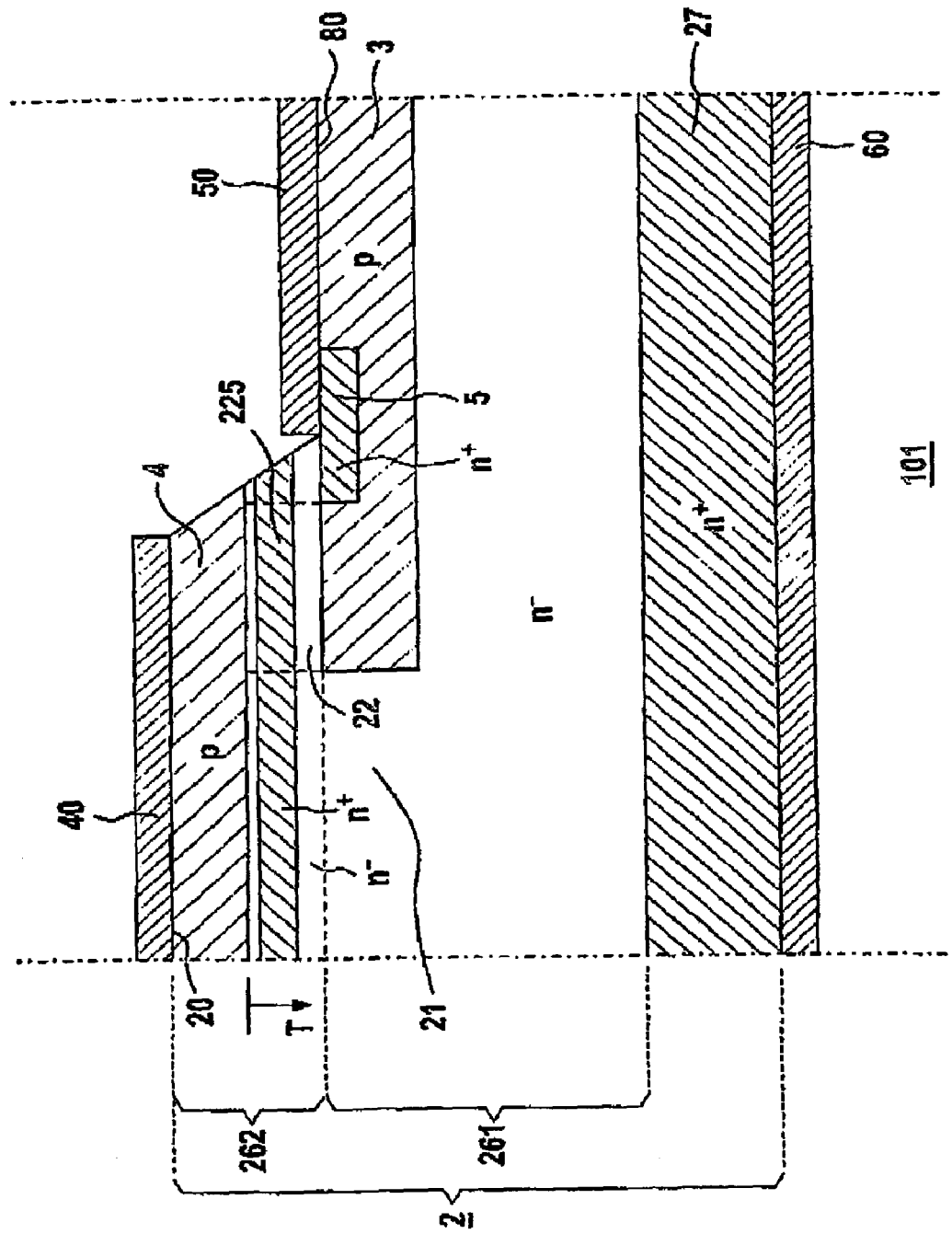
Figure 3:
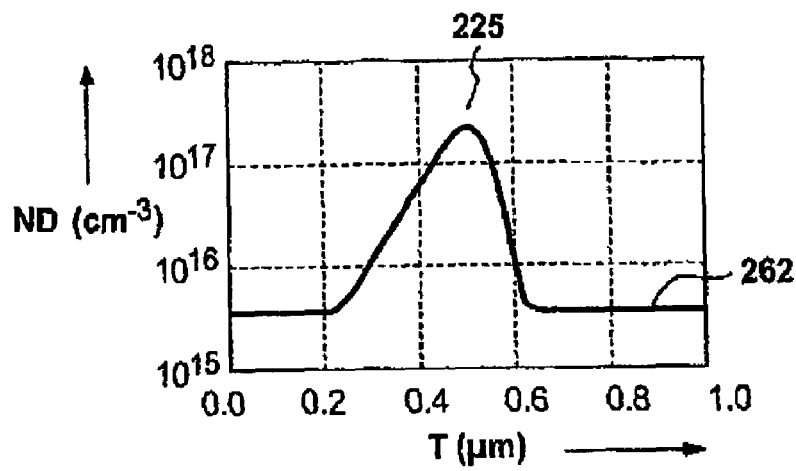
Figure 5:
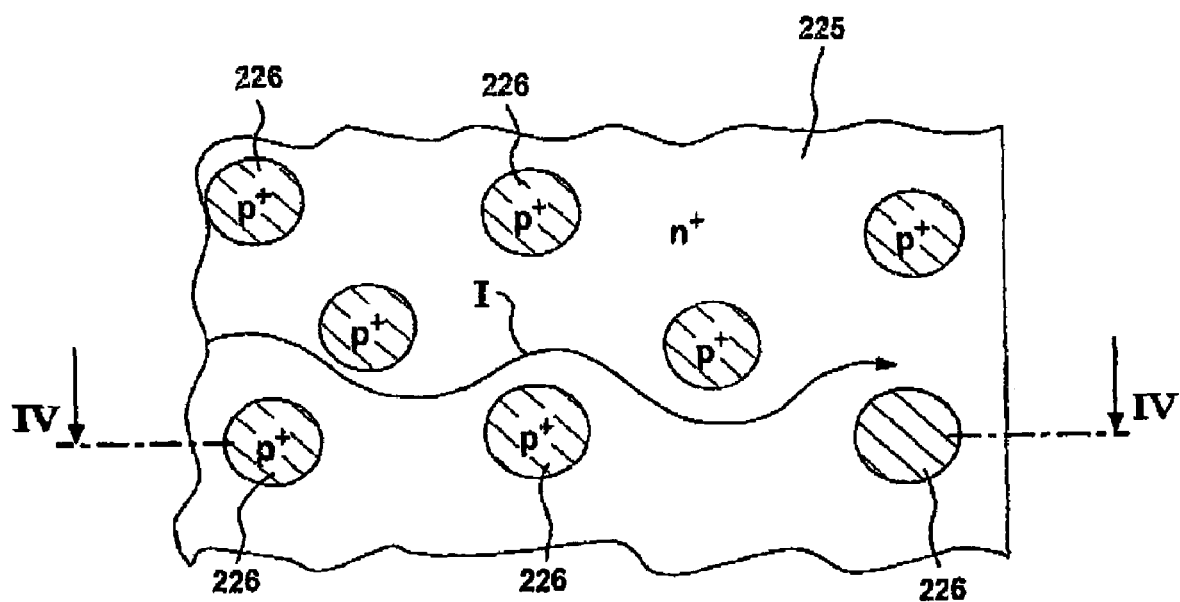
Figure 4:
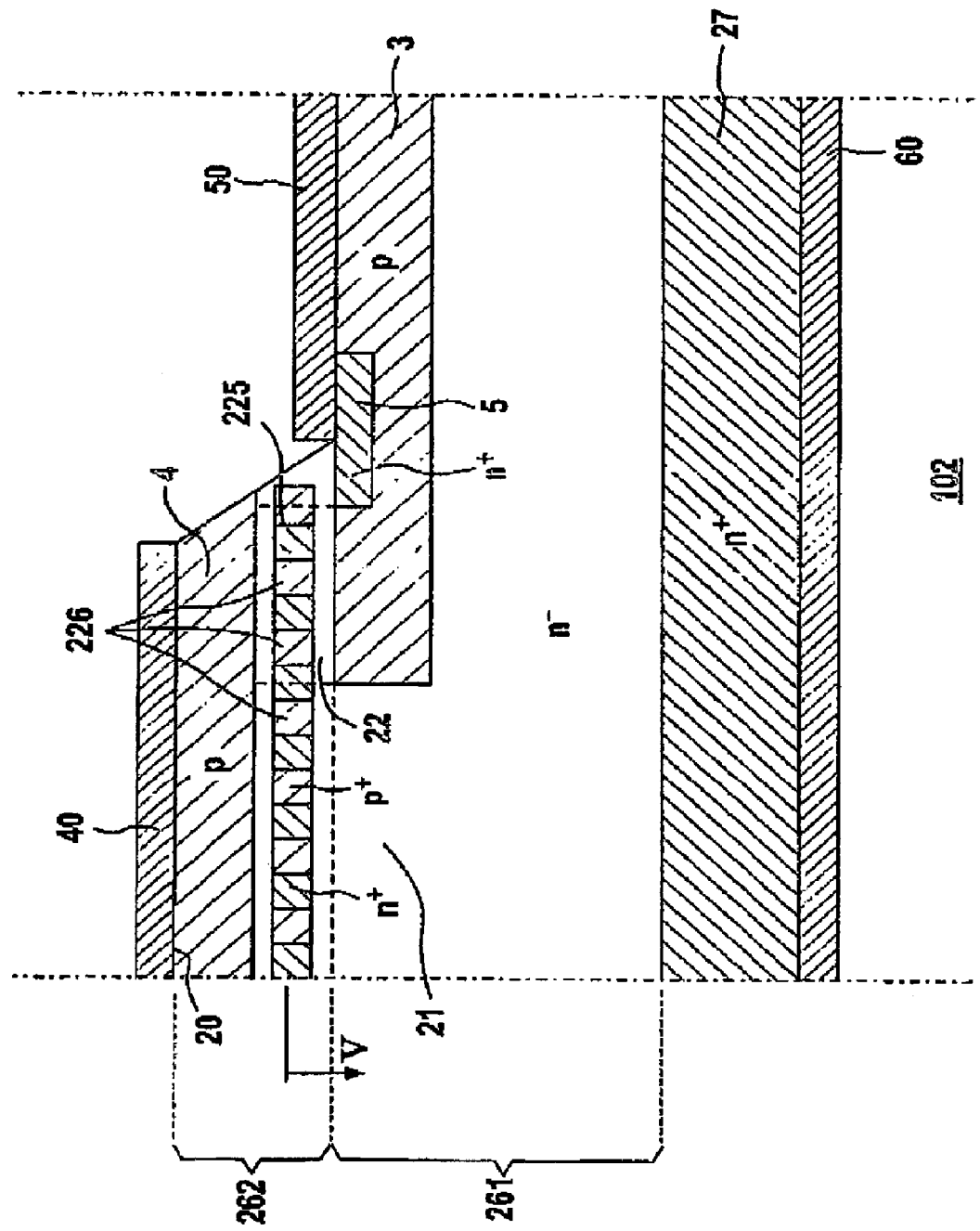

Preferred, but in no way restrictive, exemplary embodiments of the invention will now be explained in more detail with reference to the drawing. For illustration purposes, the drawing is not to scale, and certain features are represented diagrammatically. In detail:

FIG. 1 and FIG. 2 show a semiconductor configuration with a highly doped channel conduction region arranged within a channel region, and FIG. 3 shows the doping profile of the channel conduction region provided in the semiconductor configuration of FIGS. 1 and 2, FIG. 4 shows a further semiconductor configuration with a channel conduction region and channel compensation regions, FIG. 5 shows a cross section through the channel conduction region and the channel compensation regions of the semiconductor configuration of FIG. 4, and FIG. 6 to FIG. 8 show a further semiconductor configuration with a channel conduction region.

Mutually corresponding parts are provided with the same reference symbols in FIGS. 1 to 8.

FIG. 1 illustrates a semiconductor configuration 100 for controlling a current I in the form of a vertical junction field effect transistor (JFET). The semiconductor configuration shown in FIG. 1 is merely a half-cell. Mirroring at the right-hand edge of the half-cell yields a complete cell. A multicell structure is accordingly produced by multiple mirroring.

The active part, in which the current control essentially takes place, is contained in an n-conducting (electron conduction) first semiconductor region 2. Arranged within the first semiconductor region 2 is a p-conducting (hole conduction) buried island region 3. The first semiconductor region 2 has a first surface 20 and the buried island region 3 has a second surface 80. The two surfaces 20 and 80 essentially run parallel to one another. In the exemplary embodiment of FIG. 1, the first semiconductor region 2 is composed of a semiconductor substrate 27 and two epitaxially grown semiconductor layers 261 and 262 arranged thereon. The first surface 20 is associated with the second epitaxial layer 262 and the second surface 80 is associated with the first epitaxial layer 261. The two epitaxial layers 261 and 262 essentially have an identical basic doping. They are more lightly doped ($n^-$) than the semiconductor substrate 27 ($n^+$). An n-conducting contact region 5 embedded within the island region 3 is provided at the second surface 80. It is highly doped ($n^+$). The island region 3 extends further than the contact region 5 in all directions parallel to the first surface 20.

Silicon carbide (SiC) is used as semiconductor material in the semiconductor configuration 100. It is particularly well suited, in particular at high voltages, on account of its specific material properties. Preferred dopants are boron and aluminum for a p-type doping and nitrogen and phosphorus for an n-type doping. The dopant concentration of the contact region 5 typically lies between $1 \times 10^{19}$ cm$^{-3}$ and $1 \times 10^{20}$ cm$^{-3}$ and that of the two epitaxial layers 261 and 262 is typically a maximum of $5 \times 10^{16}$ cm$^{-3}$. In this case, the symbol "x" is used as a multiplication symbol. The doping of the first epitaxial layer 261 depends, in particular, on the reverse voltage that is to be taken up by the semiconductor configuration 100 in the off-state situation. The higher the reverse voltage, the lower said doping. The epitaxial layer 261 essentially has to carry the electric field to be blocked. In the example shown, both epitaxial layers 261 and 262 have a basic doping of approximately between $5 \times 10^{15}$ cm$^{-3}$ and $7 \times 10^{15}$ cm$^{-3}$. The reverse voltage is then at least 1200 V.

The buried island region 3 and the contact region 5 embedded therein are preferably produced after the application of the first epitaxial layer 261. In this case, it is possible to employ in particular the self-aligning masking technique described in U.S. Pat. No. 6,204,135 B1. The island region 3 and the contact region 5 are accordingly produced by means of two masking steps and ion implantation of p-type and n-type dopant particles into the second surface 80. Afterward, the second epitaxial layer 262 is applied in a second epitaxial growth step.

A contact hole 70 is provided within the second epitaxial layer 262, which contact hole extends in the vertical direction as far as the second surface 80. The contact hole 70 uncovers both a part of the buried island region 3 and a part of the contact region 5, so that the two regions 3 and 5 can be subjected to ohmic contact-connection by means of a first electrode 50 made of an electrically conductive material. The contact region 5 and the island region 3 are short-circuited by the first electrode 50. Polysilicon or a metal, preferably nickel, aluminum, tantalum, titanium or tungsten, is appropriate as material for the first electrode 50. The contact hole 70 is produced by means of a dry etching process, for example. In order to compensate for fluctuations in the etching depth, in accordance with an embodiment that is not illustrated, it is also possible to provide a plurality of contact holes 70, which then each have a smaller diameter.

A second electrode 60 is provided on a side of the first semiconductor region 2, which is remote from the first surface 20. The current I flowing through the semiconductor configuration 100 is conducted in and away by means of the two electrodes 50 and 60. On account of the essentially vertical current path, that is to say current path running perpendicular to the first surface 20, the semiconductor configuration 100 is also referred to as vertical.

Arranged laterally beside the contact hole 70 is a first depletion zone 24, which adjoins the first surface 20 and is situated within the first semiconductor region 2. Furthermore, there is a p-n junction present between the first semiconductor region 2 and the buried island region 3, the depletion zone of which p-n junction is designated here as second depletion zone 23. The second depletion zone 23 surrounds the entire buried island region 3. In so far as the two depletion zones 23 and 24 extend within the first semiconductor region 2, they are depicted by dashed lines in FIG. 1. The first and second depletion zones 24 and 23, respectively, bound a lateral channel region 22 in the vertical direction, which channel region lies within the first semiconductor region 2 and is part of the current path between the first and second electrodes 50 and 60, respectively. The first depletion zone 24 and the buried island region 3 are arranged in such a way that the two depletion zones 23 and 24 overlap at their lateral edges in a projection onto the first surface 20. The lateral channel region 22 is situated precisely within this overlap region.

In the lateral direction, the lateral channel region 22 is bounded by an edge 221 on the side facing the contact hole 70. Said edge 221 is formed by a projection of the contact region 5 into the first semiconductor region 2, which projection is performed perpendicularly to the first or second surface 20 or 80, respectively. Specifically, the second depletion zone 23 serving as lower vertical boundary no longer extends into the first semiconductor region 2 starting from the location at which the heavily n-doped contact region 5 is arranged within the island region 3. The p-n junction, which is critical for such a depletion zone, runs starting from this location between the n-conducting contact region 5 and the p-conducting island region 3. The lateral edge 221 is thus determined by the position of the contact region 5 within the island region 3. By contrast, the second lateral edge (not specifically designated in FIG. 1) of the lateral channel region 22 is determined by the lateral dimensioning of the island region 3. These geometric parameters can be established very accurately by the structuring method described in U.S. Pat. No. 6,204,135 B1.

The first depletion zone 24 and the contact region 5 are arranged in such a way in relation to one another that they overlap by 1 to 2 μm at their lateral edges in a projection into a common plane which is performed perpendicularly to the first or second surface 20 or 80, respectively. This last-mentioned overlap ensures that the lateral edge 221 actually reaches directly as far as the contact region 5.

The length (=lateral extent) of the lateral channel region 22 is typically between 1 μm and 5 μm in the case of a semiconductor configuration 100 produced from silicon carbide. The lateral channel region 22 is preferably made as short as possible. This results in a highly compact overall construction with a small space requirement. The vertical extent typically lies between 0.5 μm and 2 μm in the voltage- and current-free state. The depletion zones 23 and 24 are characterized by a high degree of depletion of charge carriers and thus have a significantly higher electrical resistance than the lateral channel region 22 bounded by them in the vertical direction. The spatial extent of the two depletion zones 23 and 24, in particular that in the vertical direction, varies in a manner dependent on the prevailing current and voltage conditions.

The lateral channel region 22 thus critically determines the (control) behavior of the entire semiconductor configuration 100. When designed as a current limiter, the behavior in the presence of an operating voltage in the forward direction depends on the electric current I flowing through the semiconductor configuration 100 between the two electrodes 50 and 60. As the current intensity rises, the forward voltage drop increases between the electrodes 50 and 60 on account of the bulk resistance. This leads to an enlargement of the depletion zones 23 and 24 and, consequently, to a reduction of the current-carrying cross-sectional area in the lateral channel region 22, which reduction is associated with a corresponding increase in resistance. Upon reaching a specific critical current value (=saturation current), the two depletion zones 23 and 24 touch and completely pinch off the lateral channel region 22.

Such a channel pinch-off can also be achieved by applying a control voltage to the semiconductor configuration 100 in particular such that the first depletion zone 24 is enlarged in the vertical direction. The control voltage that has to be applied given a vanishing voltage between the first and second electrodes 50 and 60, respectively, in order to achieve a channel pinch-off is also called pinch-off voltage.

The current path between the first and second electrodes 50 and 60, respectively, comprises, in the forward direction, the contact region 5, the lateral channel region 22, a vertical channel region 21 arranged in the first semiconductor region 2, and a subsequent drift zone composed of the remaining part of the first epitaxial layer 261 and the substrate 27.

By contrast, upon application of an operating voltage in the reverse direction, the current flow takes place essentially via a backward diode 90 formed by the buried island region 3 and the underlying part of the first semiconductor region 2.

The behavior of the lateral channel region 22, which is critical for the current control, is determined in particular by the second epitaxial layer 262. The properties of the second epitaxial layer 262 influence in particular the pinch-off voltage, a voltage which is applied for controlling the first depletion zone 24 and starting from which a current flow occurs between the depletion zone 24 and the buried island region 3 (=punch-through voltage), the maximum current I flowing between the two electrodes 50 and 60 (=saturation current), the electrical resistance in the channel region 22 and also to a certain extent the maximum permissible reverse voltage. The properties of the second epitaxial layer 262 may then have technology-dictated fluctuations, however. Thus, the dopant concentration in the second epitaxial layer 262 grown fluctuates. These fluctuations in the doping may amount to up to ±15% of the basic doping. Even higher deviations are likewise possible. Moreover, the thickness of the epitaxial layer 262 may be subjected to fluctuations over the cross section of the semiconductor configuration 100. These technology-dictated fluctuations may adversely affect the desired behavior of the lateral channel region 22.

In order to eliminate this influence, an n-conducting channel conduction region 225 is arranged in the second epitaxial layer 262, which channel conduction region also extends into the channel region 22 and, in particular, has a higher doping than the basic doping of the second epitaxial layer 262 and the remaining part of the channel region 22. As a result, the channel conduction region 225 has a significantly higher electrical conductivity than the remaining part of the channel region 22. In on-state operation, the current I is essentially carried within the channel conduction region 225.

Consequently, the channel conduction region 225 also largely determines the current control behavior of the semiconductor configuration 100.

The channel conduction region 225 is formed by means of the implantation of n-conducting dopant particles into the second epitaxial region 262. The doping of the channel conduction region 225 can thus be set very exactly. In particular, in contrast to a layer produced epitaxially, no comparable fluctuations in doping and thickness result. The substantial proportion, that is to say in particular at least 80%, of the total doping of n-conducting charge carriers present within the channel region 22 is situated in the channel conduction region 225. In the example shown, the implanted dopant concentration in the channel conduction region 225 is chosen such that an average dopant concentration of approximately $2\times10^{16}$ $cm^{-3}$ is present in the entire channel region 22. This corresponds to a customary dopant concentration, which is present in a manner distributed uniformly within the channel region 22 in the case of a semiconductor configuration (not shown) without a channel conduction region 225. While in the case of this embodiment which is not shown, however, the epitaxy-dictated fluctuations in the dopant concentration significantly influence the behavior of the channel region 22, the fluctuations of the second epitaxial layer 262, which is now provided with a basic doping of approximately $7\times10^{15}$ $cm^{-3}$, have practically no influence on the current control behavior of the semiconductor configuration 100. The principal part of the total charge present in the channel region 22 is situated in the channel conduction region 225 produced practically without doping fluctuations.

A further advantage of the semiconductor configuration 100 compared with the embodiment (not shown) without a channel conduction region 225 is that the channel conduction region 225, in the off-state situation, at least largely or even completely prevents an otherwise possible field punch-through into the channel region 22 and an accompanying shift in the pinch-off voltage.

On account of the ion-implanted channel conduction region 225, the semiconductor configuration 100 can be produced in a reproducible manner with a very high yield and very precisely defined electrical properties (e.g. pinch-off voltage, punch-through voltage, channel resistance, saturation current, reverse voltage). If a semiconductor wafer is used as usual during fabrication in order to be able to produce many semiconductor configurations 100 simultaneously, then a very high homogeneity of the dopings in all of the channel conduction regions 225 is achieved across the complete semiconductor wafer on account of the ion implantation used.

The depletion zone 24, which concomitantly influences the channel region 22, can be brought about in different ways within the first semiconductor region 2. Embodiments known from WO 00/16403 A1, for example, for this purpose comprise a Schottky contact or MOS (Metal Oxide Semiconductor) contact arranged on the first surface 20.

Furthermore, it is also possible, as in the case of a semiconductor configuration 101 shown in FIG. 2, to arrange a second semiconductor region 4 at the first surface 20 within the first semiconductor region 2. The semiconductor region 4 has the opposite conductivity type to the first conductivity type of the first semiconductor region 2, that is to say has the p-conductivity type in the exemplary embodiment illustrated. It is preferably produced by ion implantation. The second semiconductor region 4 is in particular heavily p-doped ($p^+$). In particular, a volume element of the second semiconductor region 4 has a total charge quantity of activated dopants which is at least 5 times, preferably at least 10 times, higher than in a comparable volume element of the channel region 22. In this case, the comparison volume element of the channel region 22 comprises a part with the basic doping but also a part with the higher doping of the channel conduction region 225. A p-n junction is present between the first semiconductor region 2 and the second semiconductor region 4, the depletion zone of said p-n junction forming the depletion zone 24 shown in FIG. 1. For reasons of improved clarity, no depletion zones are depicted in the semiconductor configuration 101 of FIG. 2. A control electrode 40 makes ohmic contact with the second semiconductor region 4, so that the extent of the depletion zone 24 and thus the current flow in the channel region 22 and in the channel conduction region 225 can be influenced by means of an external control voltage.

The semiconductor configuration 101 is an active arrangement since the current flow within the semiconductor configuration 101 can be influenced by means of an external measure (control voltage). However, other embodiments (not shown here) are also known, for example from WO 00/16403 A1, which lead to a passive current control and which, in principle, may likewise be combined with the advantageous channel conduction region 225 for the purpose of carrying current and current control.

Furthermore, the semiconductor configuration 101 of FIG. 2 is a normally on structure. This means that when there is no voltage present at the control electrode 40, the channel region 22 and/or the channel conduction region 225 are open, that is to say not pinched-off. At a control voltage of zero, current can thus flow. A normally off embodiment, which is likewise possible, in principle, and in the case of which the channel region 22 and the channel conduction region 225 are pinched-off if no control voltage is present at the control electrode 40 is not illustrated, The thickness (=vertical dimension) of the second epitaxial layer 262 or of the channel region 22 is then chosen such that the space charge zones 23 and 24 which are illustrated in FIG. 1 and which form on account of the so-called built-in potentials mutually at least touch one another and thus completely pinch-off the channel region 22 and the channel conduction region 225. In order to enable a current flow, a positive control voltage would then be necessary in the case of an exemplary embodiment which is comparable to the semiconductor configuration 101 of FIG. 2 but is a normally off exemplary embodiment. In the case of this normally off embodiment, too, the channel conduction region 225 can essentially be used with the same advantages as in the case of the normally on embodiments.

FIG. 3 illustrates a typical doping profile for a channel conduction region 225. In the diagram, a dopant concentration ND is plotted against a depth T of the channel region 22, said depth also being depicted in FIG. 2. The basic doping of the second epitaxial layer 262 can be discerned, as can the additional doping introduced into the channel conduction region 225 by ion implantation.

The channel conduction region 225 results in an additional degree of freedom in the design of the semiconductor configuration 100 or 101. The current-carrying behavior is principally determined by the doping within the channel conduction region 225, whereas the basic doping of the rest of the channel region 22 and of the second epitaxial layer 262 is of secondary importance in this regard. The basic doping can thus be selected according to other standpoints. In particular, it is favorable if the basic doping of the second epitaxial layer 262 is equal to the doping of the first epitaxial layer 261, the latter doping essentially being determined by the reverse voltage to be carried. No jump in doping is then produced at the interface 80 between the two epitaxial layers 261 and 262. Such a jump in doping might otherwise lead, in the off-state situation, to undesirable field distortions in the boundary region of the two epitaxial layers 261 and 262, which might result in a limitation of the maximum reverse field strength that can be utilized or the maximum reverse voltage that can be achieved.

FIG. 4 illustrates a particularly favorable semiconductor configuration 102, in the case of which the high concentration of n-conducting charge carriers in the channel conduction region 225 is at least partly compensated for by p-conducting channel compensation regions 226. To be more specific, a highest possible charge carrier concentration is desirable in order to achieve a best possible current conductivity in the channel conduction region 225. On the other hand, however, an excessively high charge carrier concentration leads to an increase in the pinch-off voltage that is to be applied to the control electrode 40 and is necessary in order to completely pinch-off the channel region 22. On account of the channel compensation regions 226 embedded in the channel conduction region 225, the pinch-off voltage is not increased undesirably even if a very high dopant concentration is provided within the channel conduction region 225. In an expedient manner, the total charge of p-conducting charge carriers situated within all the channel compensation regions 226 is approximately equal in magnitude to the total charge of all the n-conducting charge carriers of the channel conduction region 225. In order to achieve this, the dopant concentration is higher in the p-conducting channel compensation regions 226 than in the n-conducting channel conduction region 225. The reason for this is the larger basic area of the channel conduction region 225 compared with the basic area of all the channel compensation regions 226.

These area relationships are clearly apparent from the cross-sectional illustration of the channel conduction region 225 and of the channel compensation regions 226 as shown in FIG. 5. The course of the current I within the channel conduction region 225 is likewise depicted in FIG. 5. In addition to the round geometry illustrated, the cross-sectional area of the channel compensation regions 226 may also assume other forms, for example a square form or a strip form.

Figure 7:
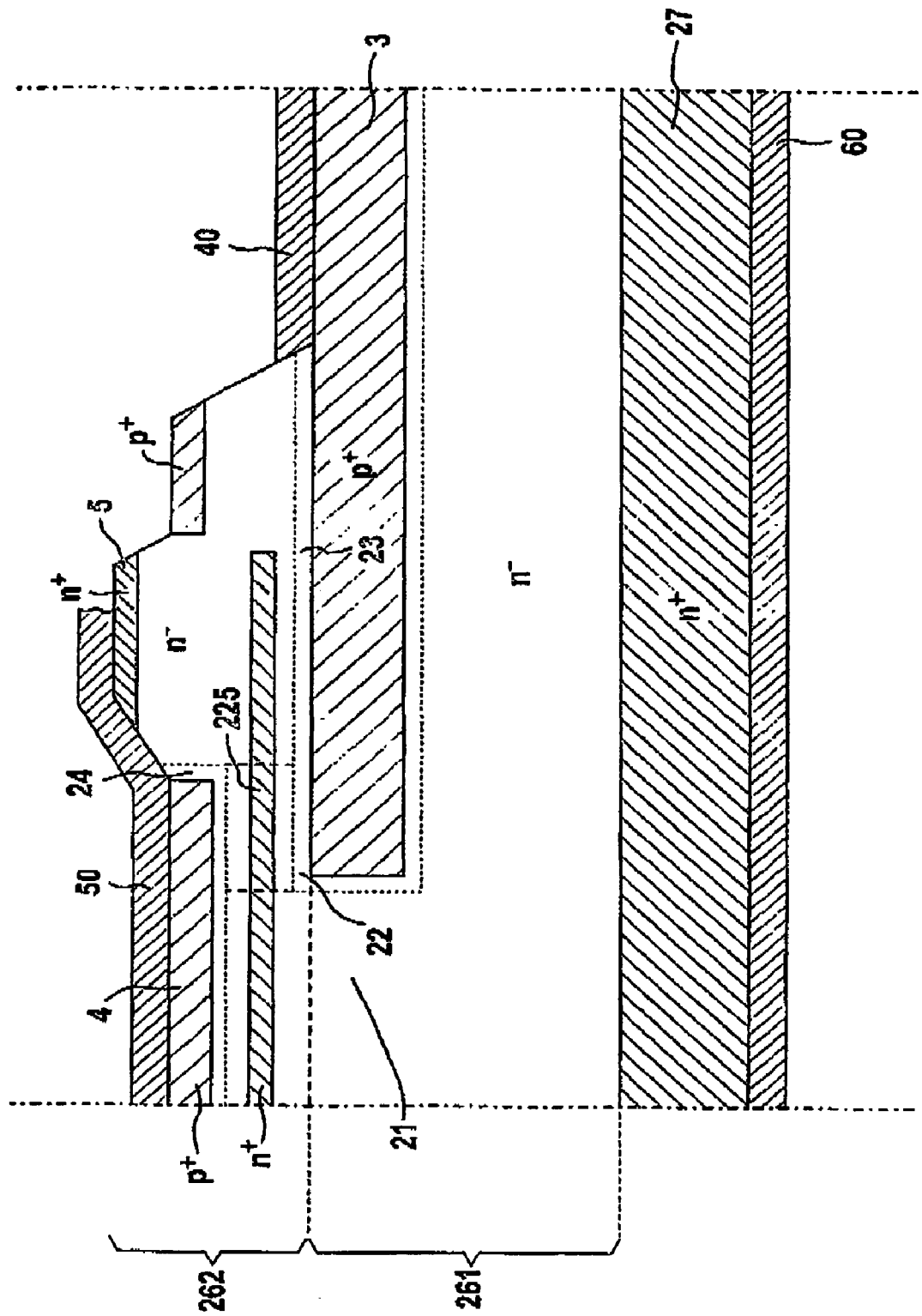
Figure 8:
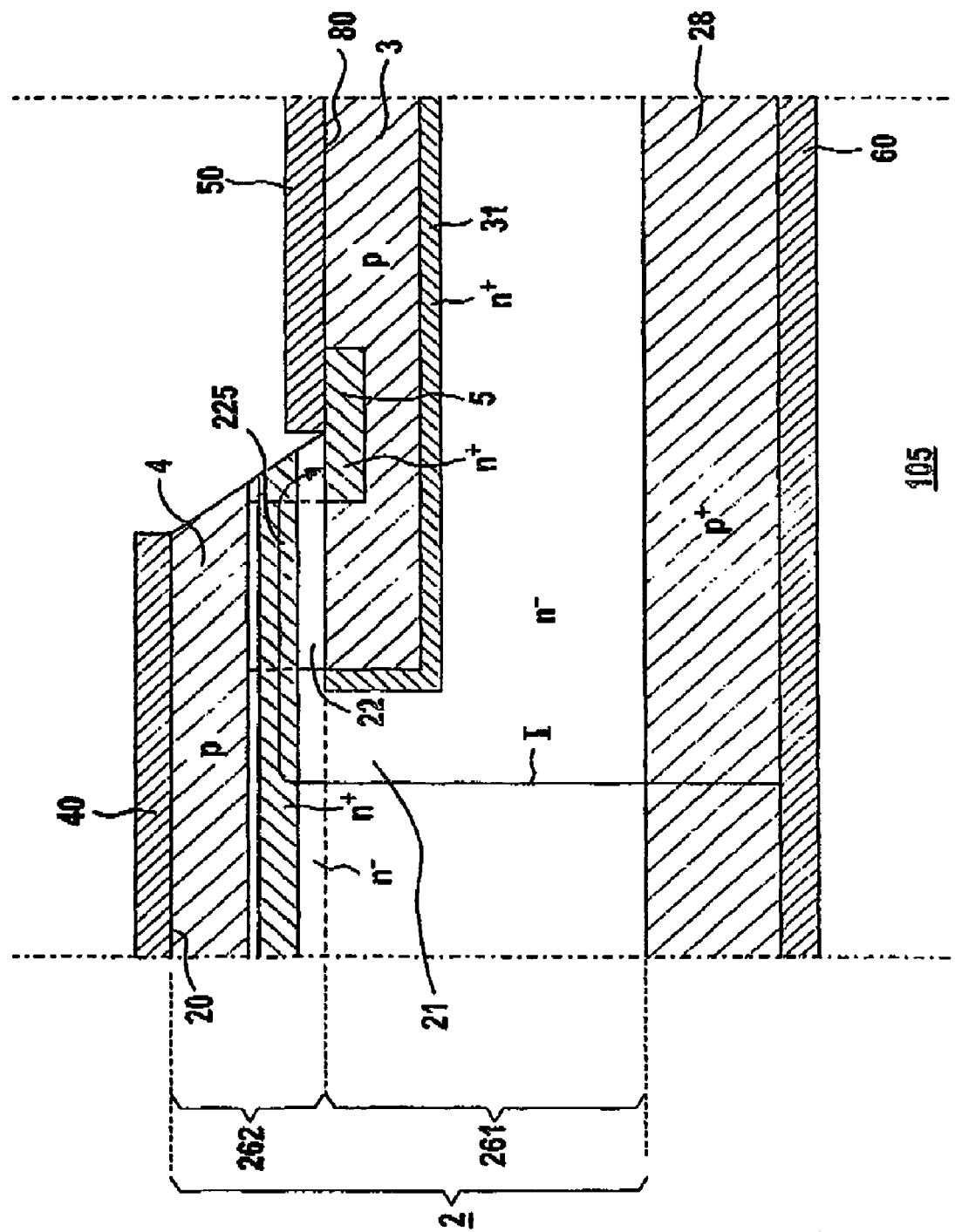

The advantageous effect of the channel region 225 may also advantageously be employed in the case of other embodiments of the semiconductor configuration that are possible, in principle, for example in the case of a semiconductor configuration 103 in accordance with FIG. 6 or in the case of a semiconductor configuration 104 in accordance with FIG. 7. Apart from the channel conduction region 225, the semiconductor configuration 103 is known from WO 00/16403 A1 and the semiconductor configuration 104 is known from DE 198 33 214 C1. Precisely as in the case of the semiconductor configurations 100, 101 and 102 disclosed in the previous figures, the semiconductor configurations 103 and 104 are also a junction field effect transistor in each case, which are realized in particular in the semiconductor material SiC.

In addition to the semiconductor configurations 100 to 104 shown in FIGS. 1, 2, 4, 6 and 7 there are also embodiments in which a p-conducting substrate 28 is used instead of the n-conducting substrate 27. Such a semiconductor configuration 105 is shown by way of example in FIG. 8. This involves a vertical JFET with a rear-side bipolar emitter (=BiFET). The first semiconductor region 2 is then composed only of the two n-conducting epitaxial layers 261 and 262 and forms a p-n junction with the p-conducting substrate 28. This additional p-n junction is favorable particularly in the case of use at a high voltage which, by way of example, is at least of the order of magnitude of a few kV.

It is further favorable that, in on-state operation, holes are injected via the contact 60 and electrons are injected via the contact 50 into the semiconductor configuration 105. This gives rise to a great increase in the charge carrier concentration. This bipolar modulation of the charge carrier concentration leads to a particularly good current conduction behavior.

In order to prevent the p-conducting island region 3 from directly extracting the holes injected from the electrode 60 and the concentration of the charge carriers available for current transport in particular below the channel conduction region 225 from decreasing on account of this, a heavily n-conducting shielding region 31 is preferably provided between the first semiconductor region 2 and the island region 3. The shielding region 31 represents an effective barrier against a direct flowing-away of the injected holes into the island region 3. As a result, a favorable high bipolar charge carrier concentration is preserved below the channel conduction region 225.

The dopant concentration of the shielding region 31 is typically one to two orders of magnitude above that of the first epitaxial layer 261. It is approximately $10^{17}$ cm$^{-3}$ in the example shown. The shielding region 31 surrounds the island region 3 in particular on the sides facing the substrate 28 and the vertical channel region 21. However, this complete shielding is not absolutely necessary. The shielding region 31 may also be provided only in regions below the island region 3.

The channel conduction region 225 also has a similarly positive shielding effect to the shielding region 31. It prevents the holes from flowing away into the p-conducting second semiconductor region 4. In addition to the improved modulation of the charge carrier concentration, this reduces the leakage current via the control electrode 40.

In alternative embodiments, the conductivity types provided in the respective regions in all of the semiconductor configurations 100 to 105 shown may also assume the respectively opposite conductivity type.

In every embodiment, the channel conduction region 225 has a favorable effect on the current control behavior and leads, in particular, to a production process that is largely independent of technology-dictated fluctuations. It is thus possible in each case to obtain a very high yield during production. It is favorable, moreover, that the respective channel region 22 can be formed with a smaller height on account of the more defined setting of the channel properties. The channel length can then also be reduced without any losses in the reverse voltage strength. The ratio of channel length to channel height is also critical for the reverse voltage strength. This ratio is greater than 1, preferably 5 and greater. In the case of the respective semiconductor configurations 100 to 105, the channel length concomitantly determines the space requirement and also the resistance in on-state operation (=$R_{on}$). Both characteristic quantities thus decrease with a reduction of channel height and channel length possible by virtue of the channel conduction region 225. A smaller space requirement enables a higher cell density of semiconductor configurations 100 to 105 that can be accommodated on a semiconductor wafer. The yield also increases as a result of this.

The invention claimed is:

1. A semiconductor configuration for controlling a current (I), comprising:
   a) a semiconductor region of a first conductivity type;
   b) an island region of a second conductivity type, opposite said first conductivity type, at least partially buried within the said semiconductor region;
   c) a current path running at least partially within said semiconductor region;
   d) a channel region:
      d1) forming a part of said semiconductor region,
      d2) having a basic doping, and
      d3) including at least one depletion zone for influencing the current;
      d4) said channel region including a channel conduction region configured for carrying the current, said channel conduction region having the first conductivity type and a higher doping than the basic doping; and
      d5) at least 80% of a total charge of said first conductivity type within said channel region being disposed within said channel conduction region.

2. The semiconductor configuration according to claim 1, wherein said current path substantially runs in the vertical direction.

3. The semiconductor configuration according to claim 1, wherein said channel region is formed as a lateral channel region.

4. The semiconductor configuration according to claim 1 formed as a field effect transistor.

5. The semiconductor configuration according to claim 1 formed as a junction field effect transistor.

6. The semiconductor configuration according to claim 1, wherein said semiconductor region is formed of silicon carbide.

7. The semiconductor configuration according to claim 1, wherein at least 90% of a total charge in said channel region is disposed in said channel conduction region.

8. The semiconductor configuration according to claim 1, which comprises at least one channel compensation region formed in said channel conduction region.

9. The semiconductor configuration according to claim 8, wherein said at least one channel compensation region has a second conductivity type opposite said first conductivity type.

10. The semiconductor configuration according to claim 8, wherein said at least one channel compensation region has a higher dopant concentration than said channel conduction region.

11. The semiconductor configuration according to claim 8, wherein a total charge of said first conductivity type introduced into said channel conduction region is approximately equal in magnitude to a total charge of said second conductivity type introduced into said channel compensation region.

12. The semiconductor configuration according to claim 8, wherein said at least one channel compensation region is one of a plurality of channel compensation regions, and wherein a total charge of said first conductivity type in said channel conduction region is approximately equal in magnitude to a total charge of said second conductivity type in all of said channel compensation regions combined.

13. The semiconductor configuration according to claim 1, wherein said channel region is formed in an epitaxial layer.

14. The semiconductor configuration according to claim 13, wherein a doping of said epitaxial layer is equal to said basic doping.

15. The semiconductor configuration according to claim 1, wherein said semiconductor region is formed with two epitaxial layers having a substantially identical doping.

16. The semiconductor configuration according to claim 1, wherein said semiconductor region is disposed on a substrate of a second conductivity type, opposite said first conductivity type, and said current path runs through said substrate.

17. The semiconductor configuration according to claim 16, which comprises a shielding region of said first conductivity type disposed between said island region and said semiconductor region, at least on a side of said island region facing said substrate.

18. A method for producing the semiconductor configuration according to claim 1, the method which comprises the following method steps:
   providing a semiconductor substrate;
   forming an epitaxial layer with a basic doping on the semiconductor substrate, the epitaxial layer including a channel region, of a first conductivity type and within which a current can be influenced; and
   implanting a channel conduction region for carrying current into the epitaxial layer at least in a region of the channel region, the channel conduction region having a higher doping compared with the basic doping and wherein at least 80% of a total charge of said first conductivity type within said channel region is disposed within said channel conduction region.

19. The method according to claim 18, wherein the epitaxial layer is a first epitaxial layer, and the method further comprises forming a second epitaxial layer, having a doping substantially identical to the basic doping, on the semiconductor substrate, the second epitaxial layer being disposed between the semiconductor substrate and the first epitaxial layer, and wherein the first and second epitaxial layers are applied to the semiconductor substrate progressively and one above the other.

20. A semiconductor configuration for controlling a current (I), comprising:
   a first semiconductor region of a first conductivity type;
   an island region of a second conductivity type, opposite said first conductivity type, at least partially buried within the said first semiconductor region;
   a first contact region of the first conductivity type disposed on a first surface of said first semiconductor region or embedded in said island region;
   a first electrode contacting at least one of said island region and said first contact region;
   a second electrode disposed opposite from said first electrode on said first semiconductor region;
   means for generating a first depletion zone within said first semiconductor region and disposed vertically above said island region and partially overlapping same in a projection thereof and forming a lateral channel region in said first semiconductor region;
   said lateral channel region forming a portion of a current path between said first and second electrodes and being vertically limited by said first depletion zone and a second depletion zone, wherein said second depletion zone is formed by a p-n transition between said island region and said first semiconductor region;
   a zone of the first conductivity type formed in said first semiconductor region and extending into said lateral channel region, said zone having a higher doping in a vertical direction that a remaining lateral channel region.

* * * * *